US012787825B2

(12) United States Patent
Yan et al.

(10) Patent No.: US 12,787,825 B2
(45) Date of Patent: Nov. 3, 2026

(54) METHODS AND APPARATUS TO REDUCE IMPEDANCE DISCONTINUITIES AND CROSSTALK IN INTEGRATED CIRCUIT PACKAGES

(71) Applicant: Intel Corporation, Santa Clara, CA (US)

(72) Inventors: Chenghai Yan, Shanghai (CN); Lei Wang, Shanghai (CN); Maoxin Yin, Shanghai (CN); Wenzhi Wang, Shanghai (CN)

(73) Assignee: Intel Corporation, Santa Clara, CA (US)

(*) Notice: Subject to any disclaimer, the term of this patent is extended or adjusted under 35 U.S.C. 154(b) by 374 days.

(21) Appl. No.: 18/570,455

(22) PCT Filed: Dec. 15, 2021

(86) PCT No.: PCT/CN2021/138186

§ 371 (c)(1),
(2) Date: Dec. 14, 2023

(87) PCT Pub. No.: WO2023/108457

PCT Pub. Date: Jun. 22, 2023

(65) Prior Publication Data

US 2024/0274521 A1 Aug. 15, 2024

(51) Int. Cl.

*H10W 70/65* (2026.01)
*H10W 44/20* (2026.01)
(Continued)

(52) U.S. Cl.

CPC ........... *H10W 70/65* (2026.01); *H10W 44/20* (2026.01); *H10W 90/701* (2026.01); *H10W 72/227* (2026.01); *H10W 90/724* (2026.01)

(58) Field of Classification Search

CPC ... H10W 70/65; H10W 44/20; H10W 90/701; H10W 72/227; H10W 90/724;
(Continued)

(56) References Cited

U.S. PATENT DOCUMENTS 10,103,054 B2 10/2018 Zhang et al.
2014/0268614 A1 9/2014 Zhang et al.
(Continued)

OTHER PUBLICATIONS

United States Patent and Trademark Office, "Notice of Allowance and Fee(s) Due," issued in connection with U.S. Appl. No. 17/733,170, dated Dec. 18, 2025, 9 pages.
(Continued)

*Primary Examiner* — Allison Bernstein
(74) *Attorney, Agent, or Firm* — Hanley, Flight & Zimmerman, LLC

(57) ABSTRACT

Methods, apparatus, systems, and articles of manufacture to reduce impedance discontinuities and crosstalk in integrated circuit packages are disclosed. A disclosed apparatus includes: a package substrate, and a ball grid array on a first surface of the package substrate. The ball grid array includes a first ball and a second ball adjacent the first ball. The ball grid array is to enable the package substrate to be electrically coupled to a circuit board. The apparatus further includes a metal interconnect within the package substrate. The metal interconnect is electrically coupled to the first ball. The metal interconnect includes an inductive loop that extends toward the second ball.

20 Claims, 11 Drawing Sheets

(51) Int. Cl.
*H10W 72/20* (2026.01)
*H10W 90/00* (2026.01)

(58) Field of Classification Search
CPC ............. H10W 70/618; H10W 90/401; H10W 70/611; H10W 70/685
See application file for complete search history.

(56) References Cited

U.S. PATENT DOCUMENTS

| | | | | |
|---|---|---|---|---|
| 2017/0229407 | A1 | 8/2017 | Zu et al. | |
| 2017/0324208 | A1 | 11/2017 | Popovic | |
| 2018/0286824 | A1 | 10/2018 | Jeng et al. | |
| 2019/0131257 | A1* | 5/2019 | Kong | H10W 20/49 |
| 2020/0066641 | A1 | 2/2020 | Aygun et al. | |
| 2020/0066692 | A1 | 2/2020 | Wolter et al. | |
| 2021/0375738 | A1 | 12/2021 | Ovard et al. | |
| 2023/0335510 | A1* | 10/2023 | Chiu | H10W 44/501 |
| 2023/0352416 | A1 | 11/2023 | Geyik et al. | |

OTHER PUBLICATIONS

International Searching Authority, "International Preliminary Report on Patentability," issued in connection with International Application No. PCT/CN2021/138186, mailed on Jun. 27, 2024, 6 pages.

United States Patent and Trademark Office, "Non-Final Office Action," issued in connection with U.S. Appl. No. 17/733,170, dated Jul. 1, 2025, 11 pages.

International Searching Authority, "International Search Report," issued in connection with PCT Patent Application No. PCT/CN2021/138186, issued on Sep. 20, 2022, 3 pages.

International Searching Authority, "Written Opinion," issued in connection with PCT Patent Application No. PCT/CN2021/138186, issued on Sep. 20, 2022, 4 pages.

* cited by examiner

METHODS AND APPARATUS TO REDUCE IMPEDANCE DISCONTINUITIES AND CROSSTALK IN INTEGRATED CIRCUIT PACKAGES

RELATED APPLICATIONS

This patent arises from the national stage of International Application No. PCT/CN2021/138186, which was filed on Dec. 15, 2021. International Application No. PCT/CN2021/138186 is hereby incorporated herein by reference in its entirety. Priority to International Application No. PCT/CN2021/138186 is hereby claimed.

FIELD OF THE DISCLOSURE

This disclosure relates generally to integrated circuits and, more particularly, to methods and apparatus to reduce impedance discontinuities and crosstalk in integrated circuit packages.

BACKGROUND

In many integrated circuit packages, one or more semiconductor dies are mechanically and electrically coupled to an underlying package substrate. Many such package substrates include a ball grid array (BGA) to enable the package to be mechanically and electrically coupled to a printed circuit board.

Figure 1:
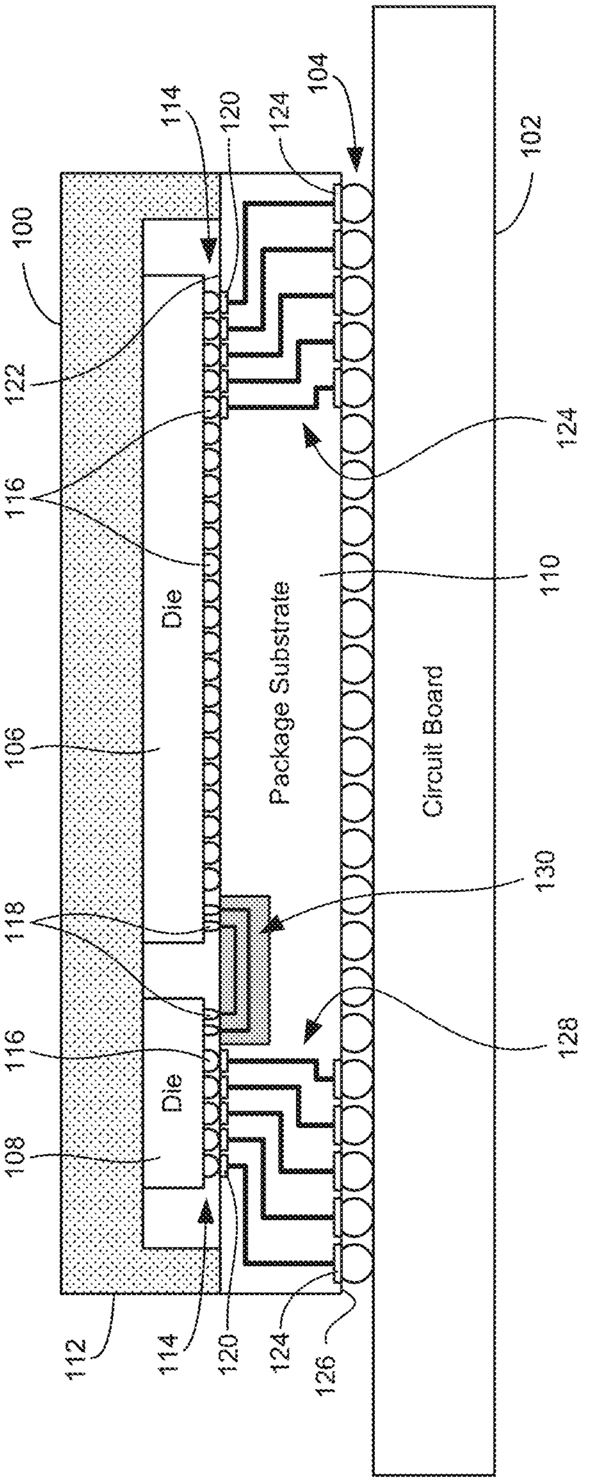
FIG. 1 illustrates an example integrated circuit (IC) package constructed in accordance with teachings disclosed herein.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term “above” describes the relationship of two parts relative to Earth. A first part is above a second part, if the second part has at least one part between Earth and the first part. Likewise, as used herein, a first part is “below” a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, “above” is not with reference to Earth, but instead is with reference to a bulk region of a base semiconductor substrate (e.g., a semiconductor wafer) on which components of an integrated circuit are formed. Specifically, as used herein, a first component of an integrated circuit is “above” a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in “contact” with another part is defined to mean that there is no intermediate part between the two parts.

Unless specifically stated otherwise, descriptors such as “first,” “second,” “third,” etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor “first” may be used to refer to an element in the detailed description, while the same element may be referred to in a claim with a different descriptor such as “second” or “third.” In such instances, it should be understood that such descriptors are used merely for identifying those elements distinctly that might, for example, otherwise share a same name.

As used herein, “approximately” and “about” refer to dimensions that may not be exact due to manufacturing tolerances and/or other real world imperfections. As used herein “substantially real time” refers to occurrence in a near instantaneous manner recognizing there may be real world delays for computing time, transmission, etc. Thus, unless otherwise specified, "substantially real time" refers to real time+/−1 second.

DETAILED DESCRIPTION

FIG. 1 illustrates an example integrated circuit (IC) package 100 constructed in accordance with teachings disclosed herein. In the illustrated example, the IC package 100 is electrically coupled to a circuit board 102 via an array of bumps or balls 104 (e.g., a ball grid array (BGA)) on a mounting surface (e.g., a bottom surface) of the package 100. In some examples, the IC package 100 may include pins and/or pads, in addition to or instead of the balls 104, to enable the electrical coupling of the package 100 to the circuit board 102. In this example, the package 100 includes two semiconductor (e.g., silicon) dies 106, 108 that are mounted to a package substrate 110 and enclosed by a package lid or mold compound 112. While the example IC package 100 of FIG. 1 includes two dies 106, 108, in other examples, the package 100 may have only one die or more than two dies. The dies 106, 108 can provide any suitable type of functionality. In some examples, the IC package 100 is a memory package (e.g., a double rate data (DDR) memory package and/or any other memory interface).

As shown in the illustrated example, each of the dies 106, 108 is electrically and mechanically coupled to the package substrate 110 via corresponding arrays of balls or bumps 114. The electrical connections between the dies 106, 108 and the package substrate 110 (e.g., the bumps 114) are sometimes referred to as first level interconnects. By contrast, the electrical connections between the IC package 100 and the circuit board 102 (e.g., the balls 104) are sometimes referred to as second level interconnects. In some examples, one or both of the dies 106, 108 may be stacked on top of one or more other dies and/or an interposer. In such examples, the dies 106, 108 are coupled to the underlying die and/or interposer through a first set of first level interconnects and the underlying die and/or interposer may be connected to the package substrate 110 via a separate set of first level interconnects associated with the underlying die and/or interposer. Thus, as used herein, first level interconnects refer to bumps between a die and a package substrate or a die and an underlying die and/or interposer.

As shown in FIG. 1, the bumps 114 of the first level interconnects include two different types of bumps corresponding to core bumps 116 and bridge bumps 118. As used herein, core bumps 116 refer to bumps on the dies 106, 108 through which electrical signals pass between the dies 106, 108 and components external to the IC package 100. More particularly, as shown in the illustrated example, when the dies 106, 108 are mounted to the package substrate 110, the core bumps 116 are physically connected and electrically coupled to first contact pads 120 on an inner surface 122 of the substrate 110. The first contact pads 120 on the first surface 122 of the package substrate 110 are electrically coupled to second contact pads 124 on an external surface 126 of the substrate 110 (e.g., a surface opposite the inner surface 122) via internal interconnects 128 within the substrate 110. The balls 104 are positioned in contact with the second contact pads 124 thereby defining a complete signal path between the bumps 114 of the dies 106, 108 and the balls 104 mounted to the circuit board 102 that pass through the first and second contact pads 120, 124 and the interconnects 128 provided therebetween. The interconnects 128 are shown as simple lines in the illustrated example of FIG. 1 for purposes of illustration. However, the interconnects 128 may be implemented by traces or electrical routing in different metal layers within the substrate 110 that are separated by layers of dielectric material. The traces in the different metal layers are electrically coupled by metal vias extending through the layers of dielectric material. Further detail regarding the particular structure of the interconnects 128 as constructed in accordance with teachings disclosed herein is provided below in connect with FIGS. 4-9.

As used herein, bridge bumps 118 refer to bumps on the dies 106, 108 through which electrical signals pass between different ones of the dies 106, 108 within the package 100. Thus, as shown in the illustrated example, the bridge bumps 118 of the first die 106 are electrically coupled to the bridge bumps 118 of the second die 108 via an interconnect bridge 130 embedded in the package substrate 110. As represented in FIG. 1, core bumps 116 are typically larger than bridge bumps 118.

In many existing IC packages, the BGA balls (e.g., the balls 104 of FIG. 1) used to mount the package on a circuit board introduce two challenges from a signal integrity perspective. The first challenge is the introduction of an impedance discontinuity or mismatch along a signal path at the point of the balls. For instance, for a signal travelling from an IC package to a circuit board (e.g., from the dies 106, 108, through the package substrate 110, and to the circuit board 102 of FIG. 1) in a typical server DDR channel, simulated testing has shown the impedance of the interconnects within the substrate (e.g., the interconnects 128 of FIG. 1) as well as in electrical traces in the circuit board is approximately 47 ohms. However, the impedance of the balls positioned therebetween is approximately 37 ohms. Thus, the balls result in an approximately 10 ohm drop in impedance relative to other portions of the signal path. The above values of the simulating testing noted above and discussed further herein are for purposes of explanation. Different values for impedance may be possible for other types of applications and/or other types of package substrate designs than the particular application and design used for the simulations. The second challenge introduced by balls on an IC package pertains to crosstalk between different signal paths associated with adjacent balls. As used herein, the term "adjacent," used in the context of two balls being adjacent to one another, means that the two balls are next to one another without another ball positioned directly therebetween. Specifically, simulated testing of far-end crosstalk in a typical DDR server channel has shown a response of approximately −29 mV when the ideal (e.g., no crosstalk) would have a response of 0 mV. As above, these values produced by simulation are provided for purposes of explanation and should not be interpreted as limiting the scope of teachings disclosed herein.

Figure 2:
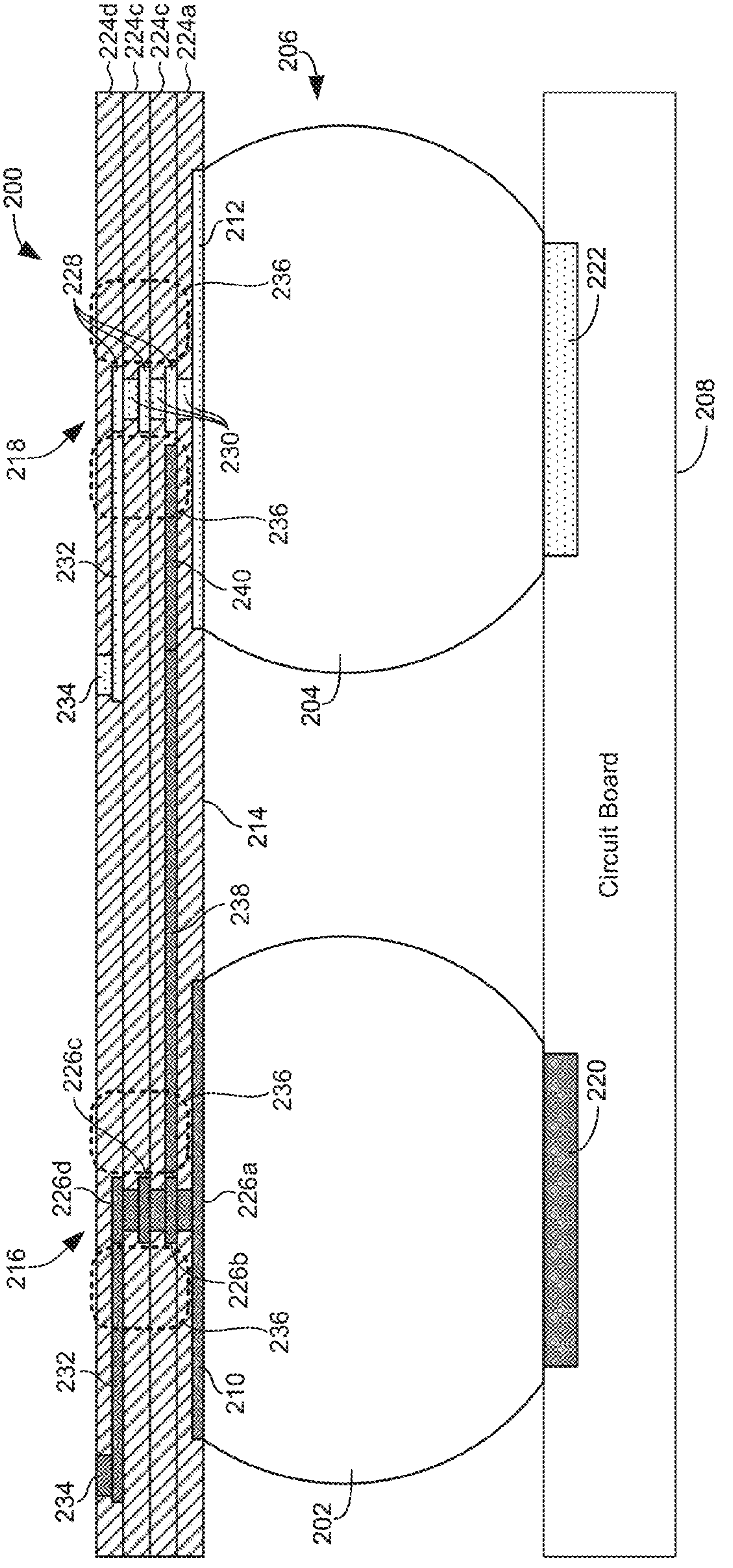
FIG. 2 (prior art)
FIG. 2 illustrates a cross-sectional view of a portion of a known package substrate showing two balls of an associated ball grid array
Figure 3:
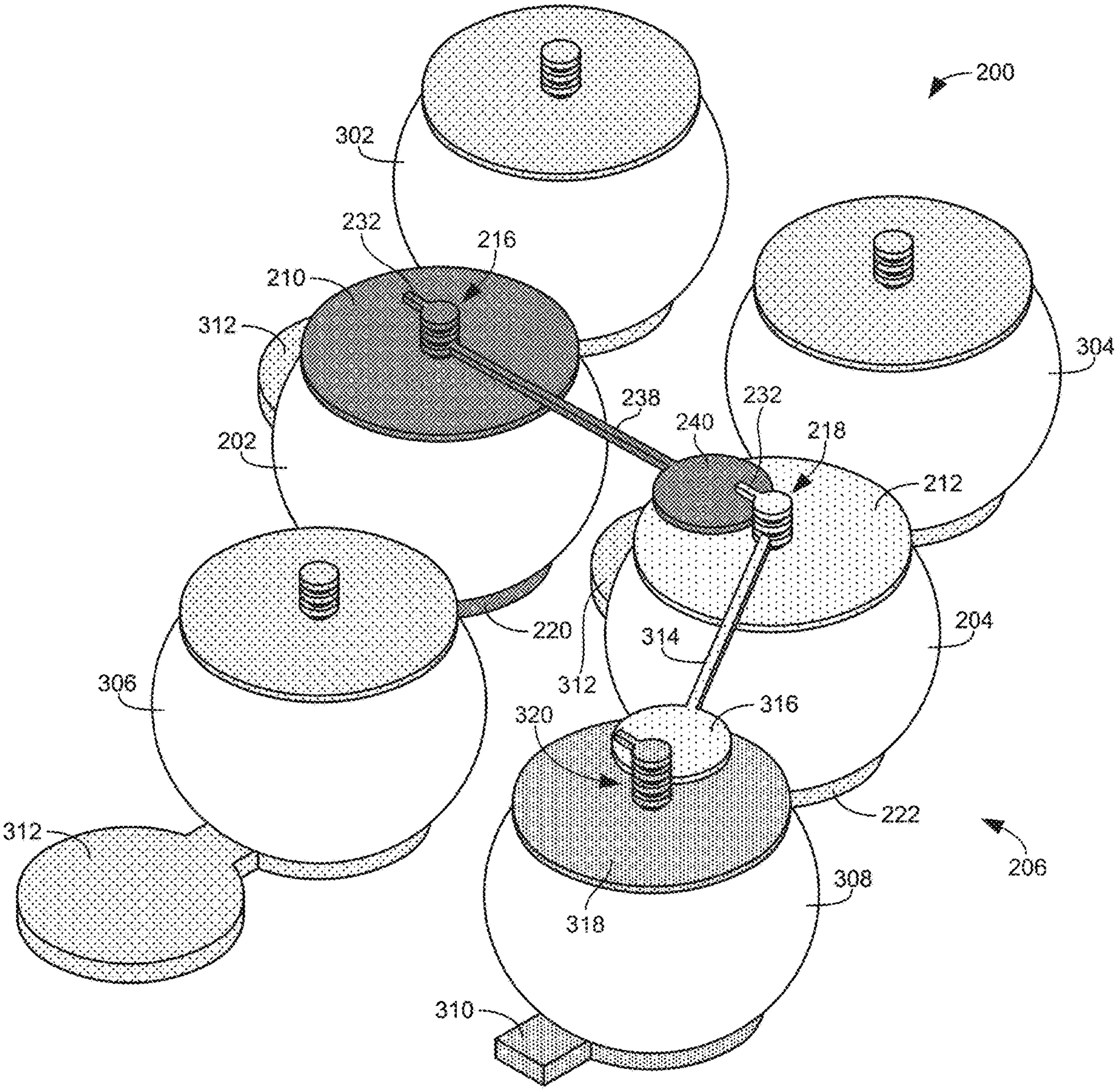
FIG. 3 (prior art)
FIG. 3 illustrates a top perspective view of the known package substrate of FIG. 2.

Several techniques have been employed in the past to mitigate against or reduce impedance discontinuities and crosstalk at balls of a BGA package as discussed in connection with FIGS. 2 and 3. FIG. 2 illustrates a cross-sectional view of a portion of a known package substrate 200 showing first and second balls 202, 204 of a ball grid array (BGA) 206 mounted to a circuit board 208. FIG. 3 is a top perspective view of the package substrate 200 of FIG. 2 with the dielectric material of the substrate 200 omitted to illustrate the metal interconnects disposed therein. As shown, the balls 202, 204 are electrically coupled with respective first and second contact pads 210, 212 on an exterior surface 214 of the package substrate 200 that are, in turn, electrically connected with corresponding first and second interconnects 216, 218. In FIG. 2, the package substrate 200 is shown as being mounted to the circuit board 208 such that the first and second balls 202, 204 are also electrically coupled to corresponding first and second contact pads 220, 222 on the circuit board 208. In FIG. 3, while the contact pads 220, 222 of the circuit board 208 are shown, the rest of the circuit board 208 is omitted for purposes of illustration. More particularly, FIG. 3 only shows the conductive (e.g., metal) components shown in FIG. 2, including the first and second contacts pads 220, 222 of the circuit board 208, the first and second balls 202, 204, the first and second contact pads 210, 212 of the package substrate 200, and the first and second metal interconnects 216, 218. For purposes of illustration, the conductive or metal components that are in electrical contact with the first ball 202 are shown in a darker shade than the conductive components in electrical contact are shown in the lighter shade. However, the same material (e.g., copper) may be used to implement the conductive components in electrical contact with both of the balls 202, 204.

The portion of the package substrate 200 shown in FIG. 2 includes four layers of dielectric material 224*a-d* (e.g., an organic-based epoxy laminate) that separate four layers of metal 226*a-d* (e.g., copper, silver, etc.) positioned in an alternating pattern. The first metal layer 226*a* includes the first and second contact pads 210, 212 at the exterior surface 214 of the substrate 200. Each of the metal interconnects 216, 218 are defined by via pads 228 in the second, third, and fourth layers of metal 226*b-c*. Further, the via pads 228 are electrically connected by metal vias 230 extending between the intervening layers of dielectric material 224*a-c*. In this instance, the uppermost via pad (e.g., the via pad 228 in the fourth metal layer 226*d*) associated with each ball 202, 204 is electrically coupled to a metal trace 232 that extends along the corresponding metal layer 226. An additional metal via 234 is electrically coupled to the metal trace 232 to extend through the uppermost layer of dielectric material 224*d* to enable the metal interconnects 216, 218 to be electrically connected to contact pads on a side of the package substrate 200 opposite the balls 202, 204 (e.g., similar to the contact pads 120 shown and described in connection with FIG. 1). In some instances, the metal interconnects 216, 218 are routed through additional build-up layers of alternating layers of metal and dielectric material before electrically coupling with an associated contact pad on the inner surface of the substrate 200.

To reduce impedance discontinuities, as shown in FIG. 2, the package substrate 200 defines void regions 236 that are positioned above the balls 202, 204 and surround the stack of vias 230 and associated via pads 228. As used herein, void regions refer to regions in which metal interconnects (e.g., planes, traces, vias, etc.) are generally excluded from being present within any metal layer (e.g., the metal layers 226*a-d*) except for interconnects directly connected to the via stack that an associated void region 236 surrounds. Thus, the metal trace 232 electrically coupled to each stack of vias 230 associated with each ball 202, 204 passes through the corresponding void region 236, but the metal in the metal layers 226*a-d* is otherwise patterned so as to avoid other interconnects from being within the void regions 236. The one other exception to metal being present within the void regions 236 is the stub 238 and associated coupling pad 240 shown in FIG. 2 and discussed further below. The larger the void regions 236, the less change in impedance across the balls 202, 204. However, the void regions 236 cannot be increased indefinitely, but are limited due to other design considerations. Thus, further enlargement of the void regions 236 is not a viable option to enable a further reduction in impedance discontinuities.

To reduce crosstalk, the known package substrate 200 includes a capacitive compensation structure in the form of a stub 238 that is electrically connected to and extends away from the first metal interconnect 216 associated with the first ball 202 towards the second metal interconnect 218 and the associated second ball 204. More particularly, as shown in FIG. 2, the stub 238 extends such that a distal end of the stub 238 is positioned over the contact pad 212 associated with the second ball 204. That is, the distal end of the stub 238 is located laterally between the via 230 in contact with the contact pad 212 and an outer perimeter or edge of the contact pad 212. As used herein, a stub refers to a length of conductive material that branches off from a portion of a metal interconnect defining a path along which electrical signals may travel. A stub is not electrically connected to any other conductive components along its length and, therefore, does not define the path for electrical signals but merely branches off from such a path.

As more clearly shown in FIG. 3, the distal end of the stub 238 includes a coupling pad or plate 240 to increase a surface area of the stub 238 adjacent the contact pad 212 of the second ball 204. As noted above, FIG. 3 is a top perspective view of the BGA 206 of FIG. 2 with the layers of dielectric materials 224*a-d* removed for purposes of illustration. In addition to showing the first and second balls 202, 204, FIG. 3 also shows third, fourth, fifth, and sixth balls 302, 304, 306, 308 of the BGA 206. As with FIG. 2, the metal components in electrical contact with different ones of the balls 202, 204, 302, 304, 306, 308 are illustrated with different shading for purposes of illustration to distinguish electrically isolated conductive components. That is, the metal components shown in one shade are electrically isolated or separated from the metal components shown in another shade. In this instance, each of the third, fourth, and fifth balls 302, 304, 306 are associated with interconnects coupled to ground. As such, each of the third, fourth, and fifth balls 302, 304, 306 are electrical coupled to a ground via 312 in the underlying circuit board 208. By contrast, each of the first, second, and sixth balls 202, 204, 308 are associated with different signal paths through the package substrate 200 of FIG. 2. As such, each of the first, second, and sixth balls 202, 204, 308 is electrical coupled to a signal trace 310 (only one of which is shown) in the circuit board 208. Inasmuch as the first, second, and sixth balls 202, 204, 308 are associated with signal paths, there is the potential for crosstalk between them. Accordingly, as shown in FIG. 3, in addition to the first metal interconnect 216 (associated with the first ball 202) including a stub 238 that extends toward the second ball 204, the second metal interconnect 218 (associated with the second ball 202) also includes a stub 314 that extends toward the sixth ball 308 with a correspond coupling pad 316 at the distal end of the stub 314.

Notably, as most clearly shown in FIG. 2, the stub 238 (and the rest of the first interconnect 216) is electrically isolated from (e.g., physically spaced apart from) the second interconnect 218 and the associated second contact pad 212. Likewise, the stub 314 and the corresponding coupling pad 316 associated with the second interconnect 218 are electrically isolated from the sixth ball 308 and its associated contact pad 318 and corresponding interconnect 320. However, due to the proximity of the distal end of the stubs 238, 314 (and, more particularly, the coupling pads 240, 316), the stubs 238, 314 are capacitively coupled with the adjacent contact pads 212, 318 over which they extend.

The capacitive coupling of the stubs 238, 314 and the adjacent contact pads 212, 318 of adjacent balls 204, 308 serves to reduce crosstalk. Specifically, simulated testing has shown that implementation of the stub in a DDR server channel can reduce crosstalk from approximately −29 mV to approximately −12 mV. While this is an improvement, such an implementation has negative impacts including more insertion loss and an increase in impedance discontinuity. More particularly, while the use of the stubs 238, 314 has been shown to reduce crosstalk to approximately −12 mV, the stub 238 lowers impedance at the balls 202, 204, 308 to approximately 32 ohms, thereby resulting in a drop of approximately 15 ohms relative to the impedance of approximately 47 ohms in the interconnects within the substrate 200 and the circuit board 208 as discussed above. As noted above, the values resulting from the simulating testing are provided for purposes of explanation and do not limit the scope of the examples disclosed herein. Under different circumstance, for different applications, and/or using different package substrate designs, the values may be higher or lower than those identified above.

Examples disclosed herein reduce crosstalk beyond what has been achieved using the stubs 238, 314 described above in connection with FIGS. 2 and 3 while at the same time reducing impedance discontinuities beyond that which has been previously achieved. More particularly, in some examples, an inductive and capacitive compensation structure is implemented to simultaneously compensate for the impedance discontinuity and crosstalk caused by BGA balls. In some examples, the inductive and capacitive compensation structure is a combination of an inductive loop and a stub-less capacitive coupling pad or plate. That is, in some examples disclosed herein, a capacitive coupling pad is used similar to that shown and described in FIGS. 2 and 3. However, rather than being attached to a distal end of a stub, in examples disclosed herein, the coupling pad is incorporated into an inductive loop that defines a portion of the path along which an electrical signal is to travel along a metal interconnect. The coupling pad is implemented to compensate for crosstalk, whereas the inductive loop is to compensate for the low impendence of the BGA balls. Thus, in some examples, the inductive loop can be implemented without the use of the coupling pad to focus on compensating for low impedance.

According to transmission line theory, impedance can be expressed as $$Z \cong \sqrt{L/C} \qquad \text{Eq. 1}$$

where Z is the impedance, L is the inductance, and C is the capacitance. Based on the relationship defined in Equation 1 it can be seen that both increasing the inductance and reducing the capacitance can increase the impedance. Increasing the size of void regions above BGA balls (e.g., the void regions 236 of FIG. 2) serves to reduce capacitance. However, as discussed above, this is insufficient to resolve the significant drop in impedance at the balls relative to the impedance of the interconnects in an associated package substrate and circuit board. The inductive loop included in examples disclosed herein increase inductance, thereby increasing the impedance of the BGA balls, which in turn reduces the impedance discontinuity at the BGA balls. Thus, the example inductive loops disclosed herein are example means for reducing impedance discontinuities. The particular inductance provided by the inductive loop can be tuned for particular applications by modifying the width and/or length of the inductive loop.

Further, according to transmission line theory, far-end crosstalk can be expressed as $$\text{Far\_end\_crosstalk} \propto \frac{C_m}{C} - \frac{L_m}{L} \qquad \text{Eq. 2}$$

where $C_m$ and $L_m$ are the mutual capacitance and mutual inductance, respectively, and C and L are the self-capacitance and self-inductance, respectively. Without a coupling pad (e.g., the coupling pads 240, 316 of FIGS. 2 and 3) the polarity of the crosstalk is negative because the ratio of mutual inductance to self-inductance ($L_m/L$) is larger than the ratio of mutual capacitance to self-capacitance ($C_m/C$). However, the implementation of a coupling pad increases the mutual capacitance and, therefore, increases the ratio of mutual capacitance to self-capacitance ($C_m/C$). As a result, the far-end crosstalk is reduced. Thus, the example coupling pads disclosed herein are example means for reducing crosstalk. However, unlike the coupling pad at the end of the stubs 238, 314, this does not have a significant negative impact on the impedance because the impedance is separately compensated for by the inductive loop. Therefore, both crosstalk and impedance discontinuities are reduced relative to existing package substrate designs.

More particularly, simulated testing (detailed herein for purposes of explanation) has shown examples disclosed herein can increase the impedance of BGA balls on a DDR server channel to approximately 40 ohms, thereby resulting in a much smaller drop from the approximately 47 ohms impedance of the interconnects in the package substrate and the circuit board on either side of the balls. Indeed, this is an improvement of approximately 8 ohms relative to the design shown and described in connection with FIGS. 2 and 3. Further, simulated testing has shown examples disclosed herein reduce crosstalk to approximately −9 mV, which is an improvement of approximately 3 mV relative to the design shown and described in connection with FIGS. 2 and 3. Such improvements produce an eye diagram for signals of a DDR 9600 memory package with an eye height margin improved (relatively to previous designs) by approximately 78 mV (from approximately −22 mV to approximately 56 mV) in the read mode and improved by approximately 54 mV (from approximately 13 mV to approximately 67 mV) in the write mode. Further, the eye width is improved by approximately 19 ps (from approximately −5 ps to approximately 14 ps) in the read mode and improved by approximately 21 ps (from approximately −7 ps to approximately 14 ps) in the write mode. These improvements are sufficient to support the speed of the DDR to be increased by a speed bin (e.g., from the 9600 MT/s speed bin up to the 10,400 MT/s speed bin). Additionally, simulated testing has shown an improvement in the insertion loss by approximately 1.2 dB at 10 GHz and an improvement in the return loss by approximately 7.5 dB at 5 GHz.

Figure 4:
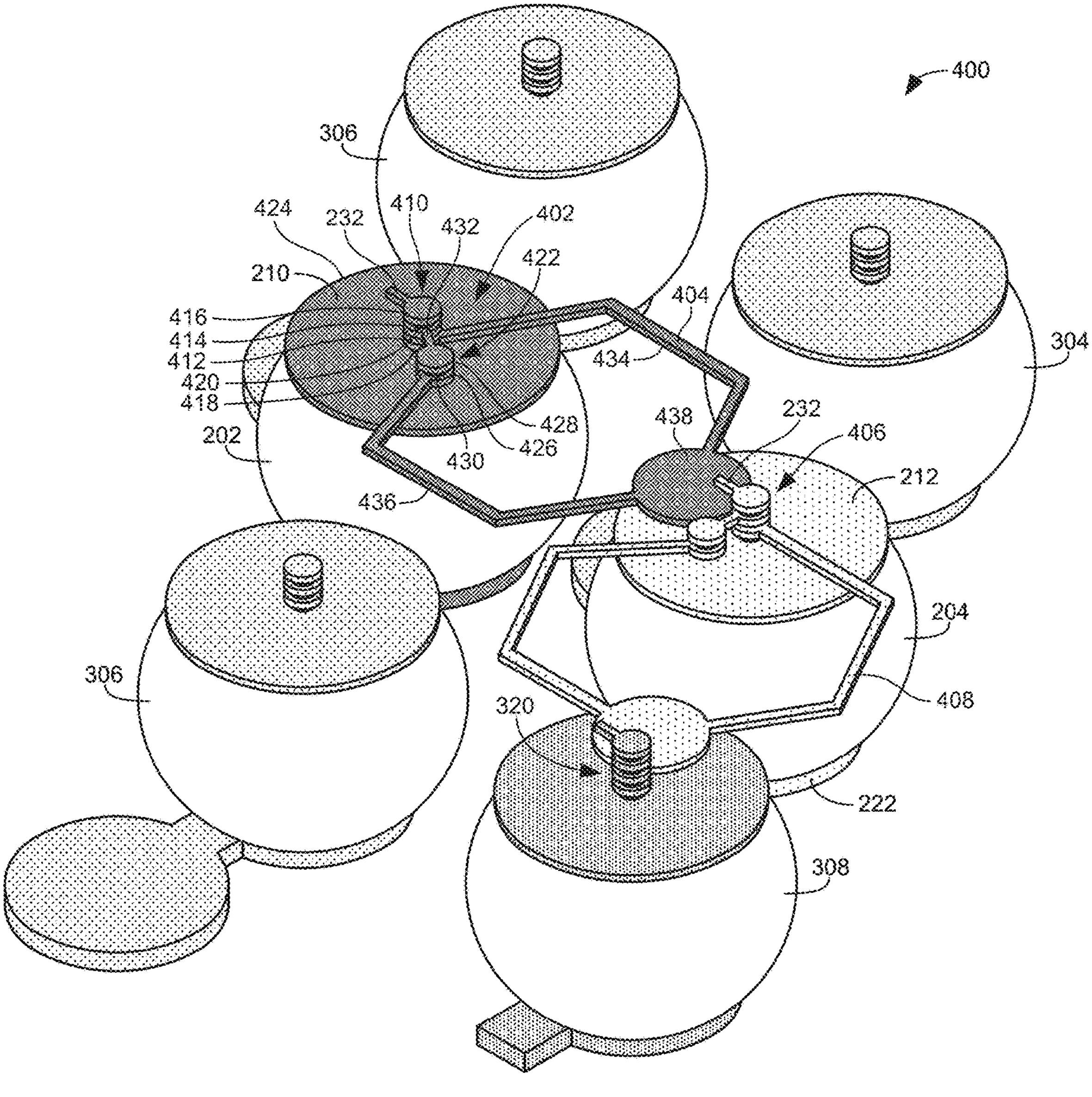
FIG. 4 illustrates a portion of an example package substrate constructed in accordance with teachings disclosed herein
Figure 5:
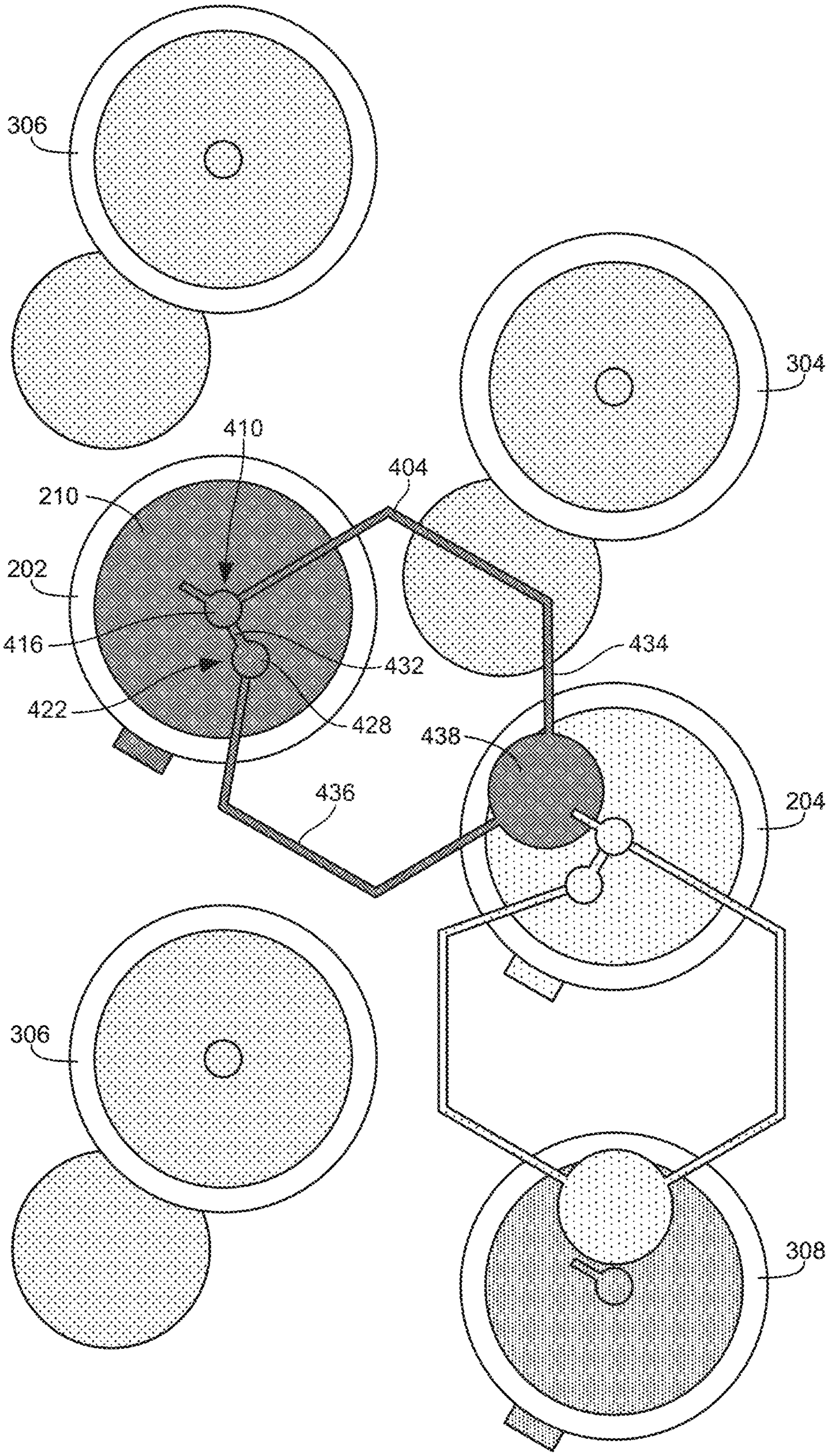
FIG. 5 illustrates a top view of the example package substrate of FIG. 4.
Figure 6:
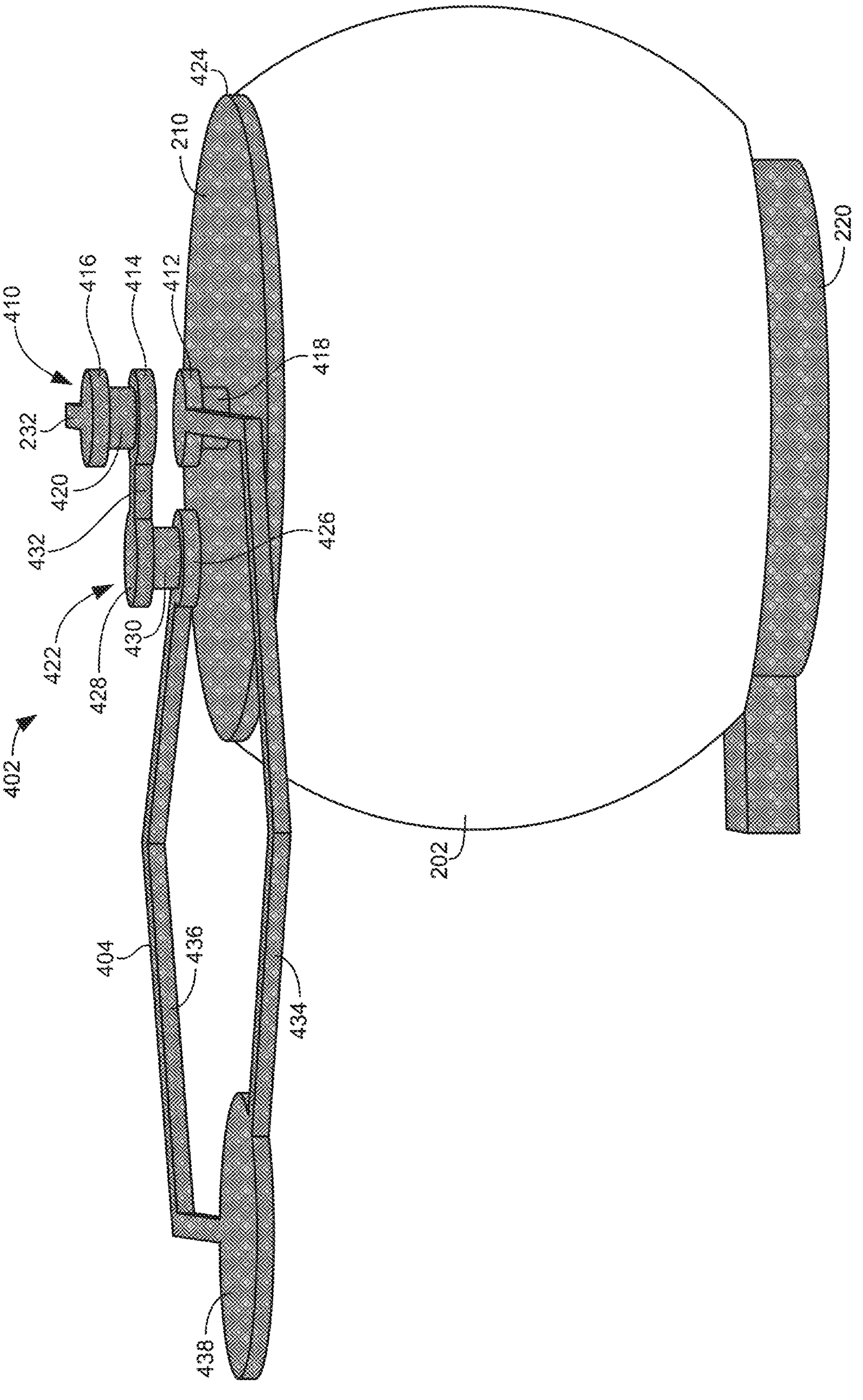
FIG. 6 illustrates an enlarged perspective view of one of the balls and associated metal interconnect of the example package substrate of FIGS. 4 and 5.
Figure 7:
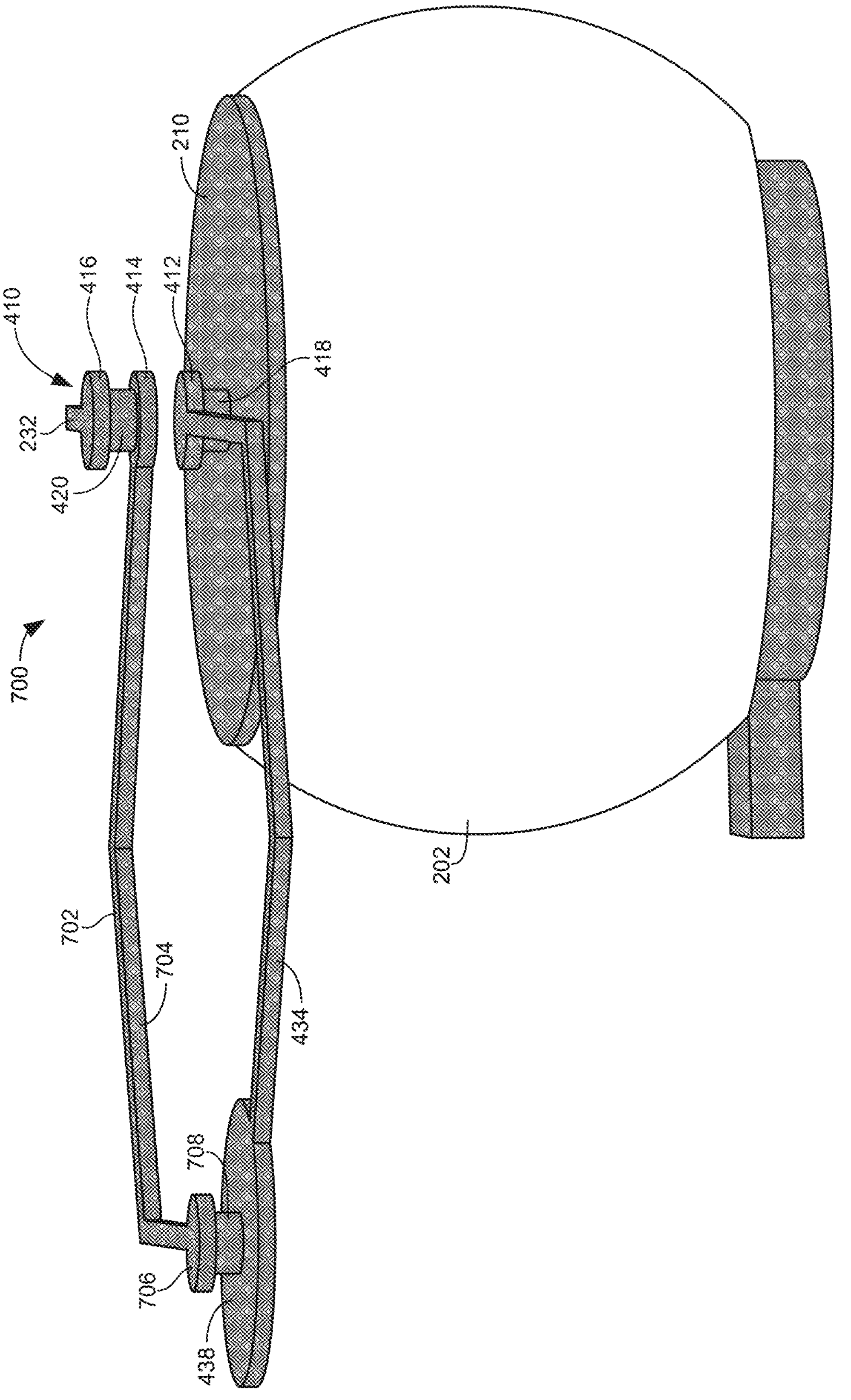
FIG. 7 illustrates a perspective view of a ball and associated metal interconnect of another example package substrate constructed in accordance with teachings disclosed herein.

Example structures to achieve the above noted advantages and improvements are shown and described in connection with FIGS. 4-9. In particular, FIG. 4 illustrates a top perspective view of a portion of an example package substrate 400 that may be used to implement the package substrate 110 of FIG. 1. The example package substrate 400 shown in FIG. 4 is similar to the package substrate 200 shown in FIG. 3 except as discussed below. Accordingly, for purposes of explanation, the same reference numerals used in FIGS. 2 and 3 are used to identify the same or similar structures and/or features shown in the example package substrate 400 of FIG. 4. As with FIG. 3, in the illustrated example of FIG. 4, only the metal components are shown with the dielectric material (e.g., the layers of dielectric material 224*a-d* of FIG. 2) omitted to enable a representation of the structure of the metal interconnects. Further, the metal components associated with different ones of the balls 202, 204, 302, 304, 306, 308 are distinguished by different shading for purposes of illustration. FIG. 5 is a top view of the example package substrate 400 as shown in FIG. 4 (e.g., only the metal components are represented). FIG. 6 is an enlarged perspective view of the first ball 202 and the associated metal components to which the first ball 202 is connected.

One difference between the example package substrate 400 of FIG. 4-6, relative to FIGS. 2 and 3, is that the first ball 202 in FIGS. 4-6 is associated with a first metal interconnect 402 that includes a first inductive loop 404 that defines a portion of the signal path along which electrical signals must follow when being transmitted between the package substrate and the underlying circuit board. That is, unlike the stubs 238, 314 of FIGS. 2 and 3, which merely branch off the signal path without being necessary to carry electrical signals, the inductive loop 404 and the rest of the associated interconnect 402 are constructed to cause electrical signals to pass around the inductive loop 404. The second ball 204 in the illustrated example is associated with a second metal interconnect 406 that includes a second inductive loop 408. In this example, the second metal interconnect 406 and the associated second inductive loop 408 are substantially the same as the first metal interconnect 402 and the associated first inductive loop 404. Accordingly, only the first metal interconnect 402 and the associated first inductive loop 404 will be described in detail herein.

As shown in the illustrated example, the first metal interconnect 402 includes a first via stack 410 that includes a first via pad 412, a second via pad 414, and a third via pad 416. As used herein, a via stack refers to one or more via pads and one or more metal vias arranged in alignment in a direction generally perpendicular to the layers of metal and dielectric material within a package substrate. These via pads 412, 414, 416 are substantially the same as the via pads 228 shown and described in connection with FIG. 2. Thus, in this example, the first via pad 412 is in the second metal layer 226*b* (FIG. 2), the second via pad 414 is in the third metal layer 226*c* (FIG. 2), and the third via pad 416 is in the fourth metal layer 226*d* (FIG. 2). Further, as with FIGS. 2 and 3, the third via pad 416 is electrical connected to the trace 232. However, unlike in FIG. 2, the via pads 412, 414, 416 of FIGS. 4-6 are not all directly connected by metal vias extending between adjacent ones of the via pads 412, 414, 416. More particularly, as shown most clearly in FIG. 6, the first via pad 412 is electrically connected to the first contact pad 210 by a first metal via 418 but the first via pad 412 is not directly connected to the second via pad 414 by a metal via. Rather, in this example, the space between the first and second via pads 412, 414 is filled with a dielectric material. A second metal via 420 extends directly between the second and third via pads 414, 416.

The first metal interconnect 402 of the illustrated example further includes a second via stack 422 that is lateral offset relative to the first via stack 410. Although laterally offset, both via stacks 410, 422 are aligned with and overlap the contact pad 210 associated with the first ball 202. That is, in some examples, both via stacks 410, 422 are laterally positioned within an outer perimeter or edge 424 of the contact pad 210. As used herein, the term "laterally positioned," used in the context of describing vias and/or via stacks relative to a contact pad, refers to the position of the vias or via stacks relative to the contact pad in a direction parallel to the planar surface of the contact pad. In other words, the via stacks 410, 422 being laterally positioned within the edge 424 of the contact pad 210 means the via stacks 410, 422 are positioned so as to overlap the contact pad 210 in a direction perpendicular to the planar surface of the contact pad 210. As shown in the illustrated examples, the second via stack 422 includes a fourth via pad 426 and a fifth via pad 428. In this example, the fourth via pad 426 of the second via stack 422 is in the same metal layer (e.g., the second metal layer 226*b* shown in FIG. 2) as the first via pad 412 of the first via stack 410. The fifth via pad 428 of the second via stack 422 is in the same metal layer (e.g., the third metal layer 226*c* shown in FIG. 2) as the second via pad 414 of the first via stack 410. Further, the third and fifth via pads 414, 428 are electrically connected by a trace 432 extending therebetween. As shown most clearly in FIG. 6, the fourth and fifth via pads 426, 428 are directly connected by a metal via 430 extending therebetween. However, in this example, there are no other metal vias in the second via stack 422. Thus, the fourth via pad 426 (and the rest of the second via stack 422) is spaced apart from the underlying contact pad 210. In this example, the space between the fourth via pad 426 and the contact pad 210 is filled with a dielectric material.

As shown in the illustrated example, the first inductive loop 404 includes a first arm 434, a second arm 436, and a coupling pad or plate 438. In this example, the first arm 434 is connected (at a first end) to the first via pad 412 in the first via stack 410 and connected (at a second end) to the coupling pad 438. The second arm 436 is connected (at a first end) to the fourth via pad 426 in the second via stack 422 and connected (at a second end) to the coupling pad 438. As a result, the entire assembly is electrically connected to enable electrical signals to pass through all of the metal components. That is, a signal from a circuit board to which the package substrate 400 is mounted will pass through the ball 202 to the contact pad 210. From the contact pad 210, the signal will pass through the first metal via 418 to the first via pad 412 to then travel around the inductive loop 404 (including the first arm 434, the coupling pad 438, and the second arm 436) before reaching the fourth via pad 426. From the fourth via pad 426, the signal will pass through the third metal via 430 to the fifth via pad 428 of the second via stack 422 and then cross the metal trace 432 to the second via pad 414 in the first via stack 410. The signal will then pass through the second metal via 420 to the third via pad 416 to reach the metal trace 232 that can route the signal to further components along the interconnect 402 as needed.

In the illustrated example of FIGS. 4-6, the coupling pad 438 is positioned in proximity to the second contact pad 212 associated with the second ball 204. As used herein, the term "proximity," used in the context of an inductive loop (and/or an associated coupling pad) being in proximity to a contact pad, means that the inductive loop (and/or the associated coupling pad) overlaps the contact pad in a direction perpendicular to a surface of the contact pad (e.g., the contact pad is between the inductive loop (and/or the associated coupling pad) and the ball attached to the contact pad. More particularly, in this example, the coupling pad 438 is in the closest adjacent metal layer (e.g., the second metal layer 226*b*) to the metal layer (e.g., the first metal layer 226*a*) associated with the second contact pad 212. This reduces the distance between the coupling pad 438 and the second contact pad 212 to increase capacitance. In other examples, the coupling pad 438 can be located in a different metal layer other than the immediately adjacent metal layer to the second contact pad 212. In some examples, the coupling pad 438 can be sized and positioned in a substantially similar manner to the coupling pad 240 shown and described above in connection with FIGS. 2 and 3. In some examples, the coupling pad 438 is omitted. In such examples, the first arm 434 and the second arm 436 are directly connected at their second ends. In some such examples, the inductive loop still extends over the second contact pad 212 associated with the second ball 204.

In the illustrated example of FIGS. 4-6, the entirety of the inductive loop 404 (including the first arm 434, the second arm 436, and the coupling pad 438) is contained within a single metal layer (e.g., the second metal layer 226*b*). In other examples, different portions of the inductive loop are in different metal layers. More particularly, the example metal interconnect 700 shown in the illustrated example of FIG. 7 includes the same first via stack 410 as shown and described in FIGS. 4-6. However, due to the design of an inductive loop 702 connected to the first via stack 410, the metal interconnect 700 of FIG. 7 does not include the second via stack 422 of FIGS. 4-6. Specifically, the example inductive loop 702 of FIG. 7 includes a similar first arm 434 and a similar coupling pad 438 as described above in FIGS. 4-6. However, unlike in FIGS. 4-6, the inductive loop 702 of FIG. 7 includes a second arm 704 that is in the third metal layer 226*c*. The second arm 704 is directly connected (at a first end) to the second via pad 414 in the first via stack 410 and directly connected (at a second end) to a sixth via pad 706 that is aligned with and overlapping the coupling pad 438. In this example, the first and second arms 434, 704 of the inductive loop 702 are electrically coupled by a fourth metal via 708 extending from the coupling pad 438 to the sixth via pad 706.

Figure 8:
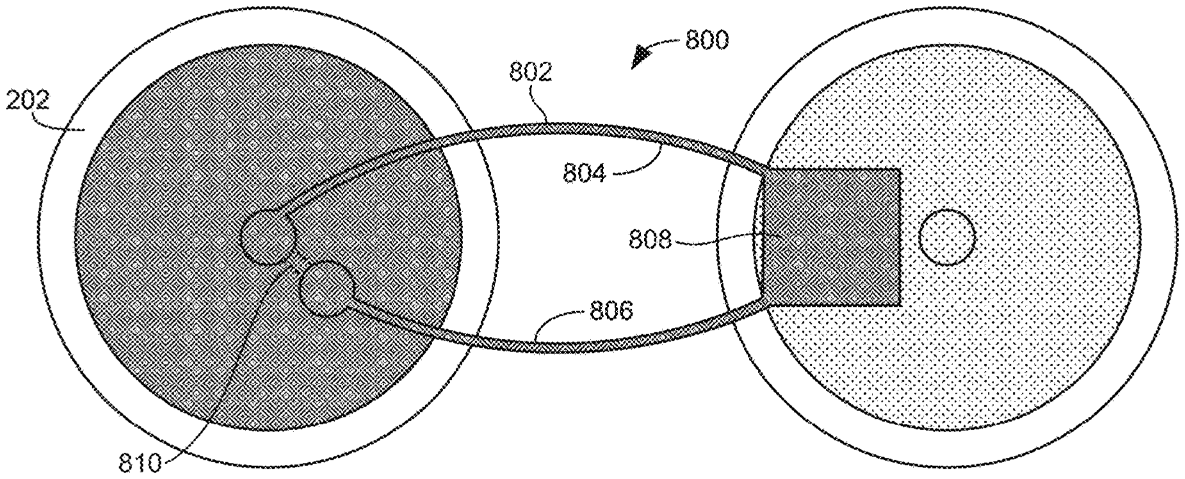
FIG. 8 illustrates a top view of a ball and associated metal interconnect of another example package substrate constructed in accordance with teachings disclosed herein.
Figure 9:
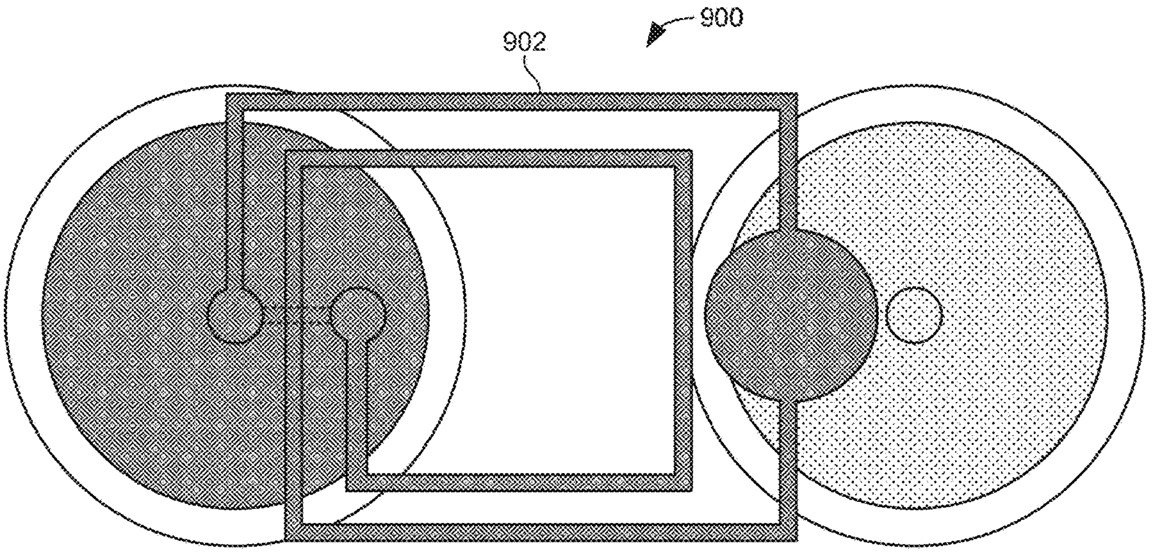
FIG. 9 illustrates a top view of a ball and associated metal interconnect of another example package substrate constructed in accordance with teachings disclosed herein.

While the example inductive loops 404, 702 of FIGS. 4-7 have a generally hexagonal shape, the inductive loops can be structured in any suitable shape (e.g., a rectangle, a square, a circle, an oval, etc.). Further, in some examples, the width of the arms of the inductive loops 404, 702 can be larger or smaller than the width shown in the illustrated examples. Likewise, while the example coupling pad 438 shown in FIGS. 4-7 has a generally circular shape, the coupling pad can be structured with any other suitable shape (e.g., a rectangle, a square, a circle, an oval, etc.) that is any suitable size. For example, FIG. 8 is a top view of another example metal interconnect 802 associated with the first ball 202 that includes an inductive loop 804 with curved arms 806, 806 and a rectangular coupling pad 808. In the illustrated example of FIG. 8, only the metal layers up to the inductive loop 804 are shown (e.g., up to the second metal layer 226*b*). The dotted lines are representative of a trace 810 in a different metal layer (e.g., the third metal layer 226*c*) that would complete the circuit for an electrical signal path similar to the trace 432 shown and described in connection with FIGS. 4-6.

In some examples, depending on the amount of inductance needed for the particular application, an inductive loop may include multiple loops (e.g., defines a path that loops by more than 360 degrees). Specifically, as shown in the illustrated example of FIG. 9, an example metal interconnect 900 includes an example inductive loop 902 that has two loops in a spiral-like configuration. As used herein, the term "spiral-like," used in the context of describing an inductive loop with more than one loop, means that the multiple loops are in a common plane (e.g., a single metal layer) but are radially spaced apart at different distances from a center around which the loops encircle. In other examples, there may be more that two loops in a spiral-like inductive loop. In this example, the inductive loop 902 includes straight arms that bend at 90 degree angles to form a generally rectangular shape. In the illustrated example, the entire spiral-like configuration of the inductive loop 902 is in the same metal layer. In other examples, different ones of the multiple loops (or portions thereof) are in separate metal layers within a package substrate. That is, in some examples, multiple loops are arranged in a coil-like configuration. As used herein, the term "coil-like," used in the context of describing an inductive loop with more than one loop, means that different ones of the multiple loops (or portions thereof) are in different planes (e.g., different metal layers) and may overlap one another in a direction perpendicular to the different planes along which the loops or loop portions extend. Further, as shown by comparison between FIGS. 8 and 9, the thickness or width of the arms of the inductive loops can differ depending on the particular applications in which the inductive loops are to be used.

The foregoing examples of the metal interconnects 402, 700, 800, 900 of FIGS. 4-9 teach or suggest different features. Although each of the example metal interconnects 402, 700, 800, 900 disclosed above have certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

The example metal interconnects 402, 700, 800, 900 of FIGS. 4-9 and, more generally, the example IC package 100 of FIG. 1 disclosed herein may be included in any suitable electronic component. FIGS. 10-13 illustrate various examples of apparatus that may include or be included in the IC package 100 disclosed herein.

Figure 10:
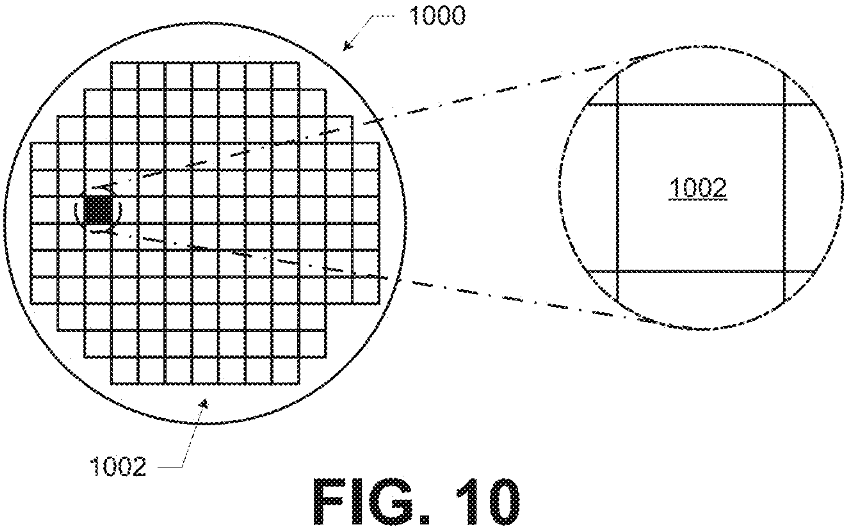
FIG. 10 is a top view of a wafer and dies that may be included in an IC package constructed in accordance with teachings disclosed herein.

FIG. 10 is a top view of a wafer 1000 and dies 1002 that may be included in the IC package 100 of FIG. 1 (e.g., as any suitable ones of the dies 106, 108). The wafer 1000 may be composed of semiconductor material and may include one or more dies 1002 having IC structures formed on a surface of the wafer 1000. Each of the dies 1002 may be a repeating unit of a semiconductor product that includes any suitable IC. After the fabrication of the semiconductor product is complete, the wafer 1000 may undergo a singulation process in which the dies 1002 are separated from one another to provide discrete "chips" of the semiconductor product. The die 1002 may include one or more transistors (e.g., some of the transistors 1140 of FIG. 11, discussed below), supporting circuitry to route electrical signals to the transistors, passive components (e.g., signal traces, resistors, capacitors, or inductors), and/or any other IC components. In some examples, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device (e.g., the processing device 1302 of FIG. 13) or other logic that is configured to store information in the memory devices or execute instructions stored in the memory array. The example IC package 100 disclosed herein may be manufactured using a die-to-wafer assembly technique in which some dies 106, 108 are attached to a wafer 1000 that include others of the dies 106, 108, and the wafer 1000 is subsequently singulated.

Figure 11:
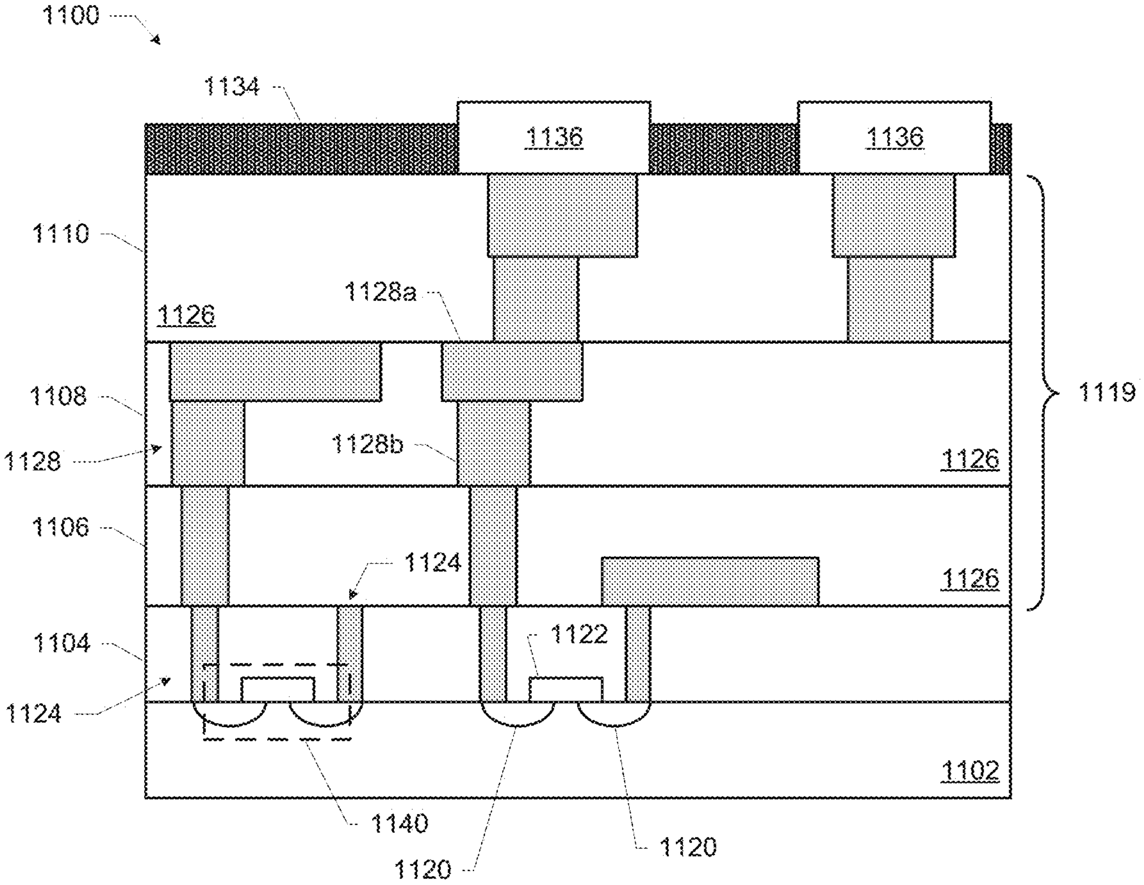
FIG. 11 is a cross-sectional side view of an IC device that may be included in an IC package constructed in accordance with teachings disclosed herein.

FIG. 11 is a cross-sectional side view of an IC device 1100 that may be included in the example IC package 100 (e.g., in any one of the dies 106, 108). One or more of the IC devices 1100 may be included in one or more dies 1002 (FIG. 10). The IC device 1100 may be formed on a die substrate 1102 (e.g., the wafer 1000 of FIG. 10) and may be included in a die (e.g., the die 1002 of FIG. 10). The die substrate 1102 may be a semiconductor substrate composed of semiconductor material systems including, for example, n-type or p-type materials systems (or a combination of both). The die substrate 1102 may include, for example, a crystalline substrate formed using a bulk silicon or a silicon-on-insulator (SOI) substructure. In some examples, the die substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 1102. Although a few examples of materials from which the die substrate 1102 may be formed are described here, any material that may serve as a foundation for an IC device 1100 may be used. The die substrate 1102 may be part of a singulated die (e.g., the dies 1002 of FIG. 10) or a wafer (e.g., the wafer 1000 of FIG. 10).

The IC device 1100 may include one or more device layers 1104 disposed on the die substrate 1102. The device layer 1104 may include features of one or more transistors 1140 (e.g., metal oxide semiconductor field-effect transistors (MOSFETs)) formed on the die substrate 1102. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 1140 along the source-channel-drain direction, the gate electrode may consist of a U-shaped structure that includes a bottom portion substantially parallel to the surface of the die substrate 1102 and two sidewall portions that are substantially perpendicular to the top surface of the die substrate 1102. In other examples, at least one of the metal layers that form the gate electrode may simply be a planar layer that is substantially parallel to the top surface of the die substrate 1102 and does not include sidewall portions substantially perpendicular to the top surface of the die substrate 1102. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 1120 may be formed within the die substrate 1102 adjacent to the gate 1122 of each transistor 1140. The S/D regions 1120 may be formed using an implantation/diffusion process or an etching/deposition process, for example. In the former process, dopants such as boron, aluminum, antimony, phosphorous, or arsenic may be ion-implanted into the die substrate 1102 to form the S/D regions 1120. An annealing process that activates the dopants and causes them to diffuse farther into the die substrate 1102 may follow the ion-implantation process. In the latter process, the die substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 1120 may be formed using one or more alternate semiconductor materials such as germanium or a group III-V material or alloy. In further examples, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 11 as interconnect layers 1106-2010). For example, electrically conductive features of the device layer 1104 (e.g., the gate 1122 and the S/D contacts 1124) may be electrically coupled with the interconnect structures 1128 of the interconnect layers 1106-2010. The one or more interconnect layers 1106-2010 may form a metallization stack (also referred to as an "ILD stack") 1119 of the IC device 1100.

The interconnect structures 1128 may be arranged within the interconnect layers 1106-2010 to route electrical signals according to a wide variety of designs (in particular, the arrangement is not limited to the particular configuration of interconnect structures 1128 depicted in FIG. 11). Although a particular number of interconnect layers 1106-2010 is depicted in FIG. 11, examples of the present disclosure include IC devices having more or fewer interconnect layers than depicted.

In some examples, the interconnect structures 1128 may include lines **1128*a* and/or vias 1128*b* filled with an electrically conductive material such as a metal. The lines 1128*a* may be arranged to route electrical signals in a direction of a plane that is substantially parallel with a surface of the die substrate 1102 upon which the device layer 1104 is formed. For example, the lines 1128*a* may route electrical signals in a direction in and out of the page from the perspective of FIG. 11. The vias 1128*b* may be arranged to route electrical signals in a direction of a plane that is substantially perpendicular to the surface of the die substrate 1102 upon which the device layer 1104 is formed. In some examples, the vias 1128*b* may electrically couple lines 1128*a* of different interconnect layers 1106-2010** together.

The interconnect layers 1106-2010 may include a dielectric material 1126 disposed between the interconnect structures 1128, as shown in FIG. 11. In some examples, the dielectric material 1126 disposed between the interconnect structures 1128 in different ones of the interconnect layers 1106-2010 may have different compositions; in other examples, the composition of the dielectric material 1126 between different interconnect layers 1106-2010 may be the same.

A first interconnect layer 1106 (referred to as Metal 1 or "M1") may be formed directly on the device layer 1104. In some examples, the first interconnect layer 1106 may include lines **1128*a* and/or vias 1128*b*, as shown. The lines 1128*a* of the first interconnect layer 1106 may be coupled with contacts (e.g., the S/D contacts 1124) of the device layer 1104**.

A second interconnect layer 1108 (referred to as Metal 2 or "M2") may be formed directly on the first interconnect layer 1106. In some examples, the second interconnect layer 1108 may include vias **1128*b* to couple the lines 1128*a* of the second interconnect layer 1108 with the lines 1128*a* of the first interconnect layer 1106. Although the lines 1128*a* and the vias 1128*b* are structurally delineated with a line within each interconnect layer (e.g., within the second interconnect layer 1108) for the sake of clarity, the lines 1128*a* and the vias 1128*b*** may be structurally and/or materially contiguous (e.g., simultaneously filled during a dual-damascene process) in some examples.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some examples, the interconnect layers that are "higher up" in the metallization stack 1119 in the IC device 1100 (i.e., further away from the device layer 1104) may be thicker.

The IC device 1100 may include a solder resist material 1134 (e.g., polyimide or similar material) and one or more conductive contacts 1136 formed on the interconnect layers 1106-2010. In FIG. 11, the conductive contacts 1136 are illustrated as taking the form of bonding pads. The conductive contacts 1136 may be electrically coupled with the interconnect structures 1128 and configured to route the electrical signals of the transistor(s) 1140 to other external devices. For example, solder bonds may be formed on the one or more conductive contacts 1136 to mechanically and/or electrically couple a chip including the IC device 1100 with another component (e.g., a circuit board). The IC device 1100 may include additional or alternate structures to route the electrical signals from the interconnect layers 1106-2010; for example, the conductive contacts 1136 may include other analogous features (e.g., posts) that route the electrical signals to external components.

Figure 12:
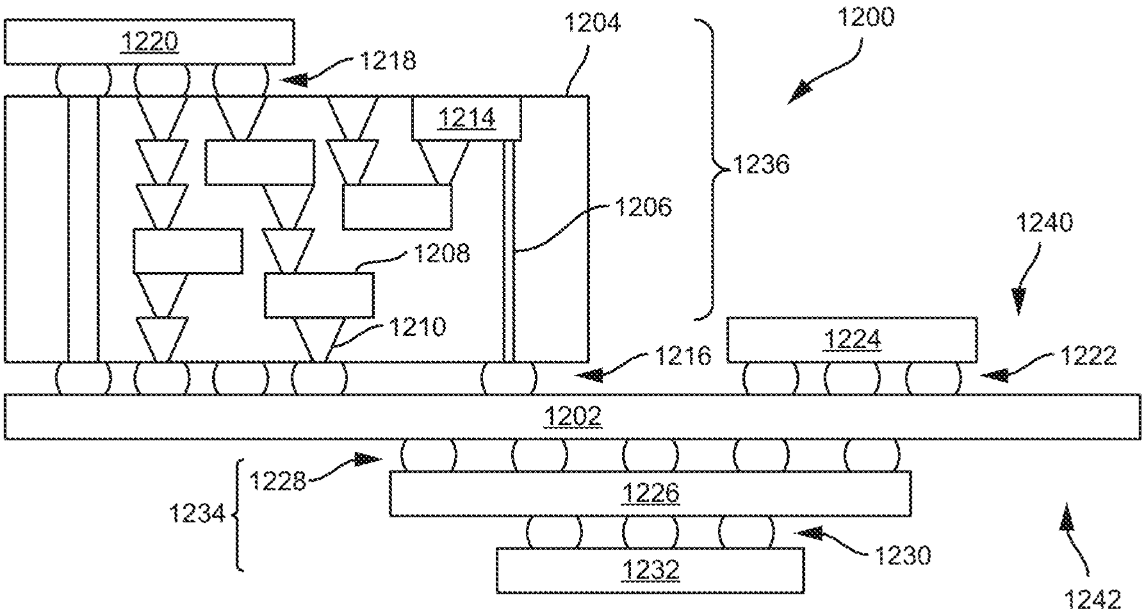
FIG. 12 is a cross-sectional side view of an IC device assembly that may include an IC package constructed in accordance with teachings disclosed herein.

FIG. 12 is a cross-sectional side view of an IC device assembly 1200 that may include the IC package 100 disclosed herein. In some examples, the IC device assembly corresponds to the IC package 100. The IC device assembly 1200 includes a number of components disposed on a circuit board 1202 (which may be, for example, a motherboard). The IC device assembly 1200 includes components disposed on a first face 1240 of the circuit board 1202 and an opposing second face 1242 of the circuit board 1202; generally, components may be disposed on one or both faces 1240 and 1242. Any of the IC packages discussed below with reference to the IC device assembly 1200 may take the form of the example IC package 100 of FIG. 1.

In some examples, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other examples, the circuit board 1202 may be a non-PCB substrate. In some examples, the circuit board 1202 may be, for example, the circuit board 102 of FIG. 1.

The IC device assembly 1200 illustrated in FIG. 12 includes a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), male and female portions of a socket, an adhesive, an underfill material, and/or any other suitable electrical and/or mechanical coupling structure.

The package-on-interposer structure 1236 may include an IC package 1220 coupled to an interposer 1204 by coupling components 1218. The coupling components 1218 may take any suitable form for the application, such as the forms discussed above with reference to the coupling components 1216. Although a single IC package 1220 is shown in FIG. 12, multiple IC packages may be coupled to the interposer 1204; indeed, additional interposers may be coupled to the interposer 1204. The interposer 1204 may provide an intervening substrate used to bridge the circuit board 1202 and the IC package 1220. The IC package 1220 may be or include, for example, a die (the die 1002 of FIG. 10), an IC device (e.g., the IC device 1100 of FIG. 11), or any other suitable component. Generally, the interposer 1204 may spread a connection to a wider pitch or reroute a connection to a different connection. For example, the interposer 1204 may couple the IC package 1220 (e.g., a die) to a set of BGA conductive contacts of the coupling components 1216 for coupling to the circuit board 1202. In the example illustrated in FIG. 12, the IC package 1220 and the circuit board 1202 are attached to opposing sides of the interposer 1204; in other examples, the IC package 1220 and the circuit board 1202 may be attached to a same side of the interposer 1204. In some examples, three or more components may be interconnected by way of the interposer 1204.

In some examples, the interposer 1204 may be formed as a PCB, including multiple metal layers separated from one another by layers of dielectric material and interconnected by electrically conductive vias. In some examples, the interposer 1204 may be formed of an epoxy resin, a fiberglass-reinforced epoxy resin, an epoxy resin with inorganic fillers, a ceramic material, or a polymer material such as polyimide. In some examples, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The IC device assembly 1200 may include an IC package 1224 coupled to the first face 1240 of the circuit board 1202 by coupling components 1222. The coupling components 1222 may take the form of any of the examples discussed above with reference to the coupling components 1216, and the IC package 1224 may take the form of any of the examples discussed above with reference to the IC package 1220.

The IC device assembly 1200 illustrated in FIG. 12 includes a package-on-package structure 1234 coupled to the second face 1242 of the circuit board 1202 by coupling components 1228. The package-on-package structure 1234 may include a first IC package 1226 and a second IC package 1232 coupled together by coupling components 1230 such that the first IC package 1226 is disposed between the circuit board 1202 and the second IC package 1232. The coupling components 1228, 1230 may take the form of any of the examples of the coupling components 1216 discussed above, and the IC packages 1226, 1232 may take the form of any of the examples of the IC package 1220 discussed above. The package-on-package structure 1234 may be configured in accordance with any of the package-on-package structures known in the art.

Figure 13:
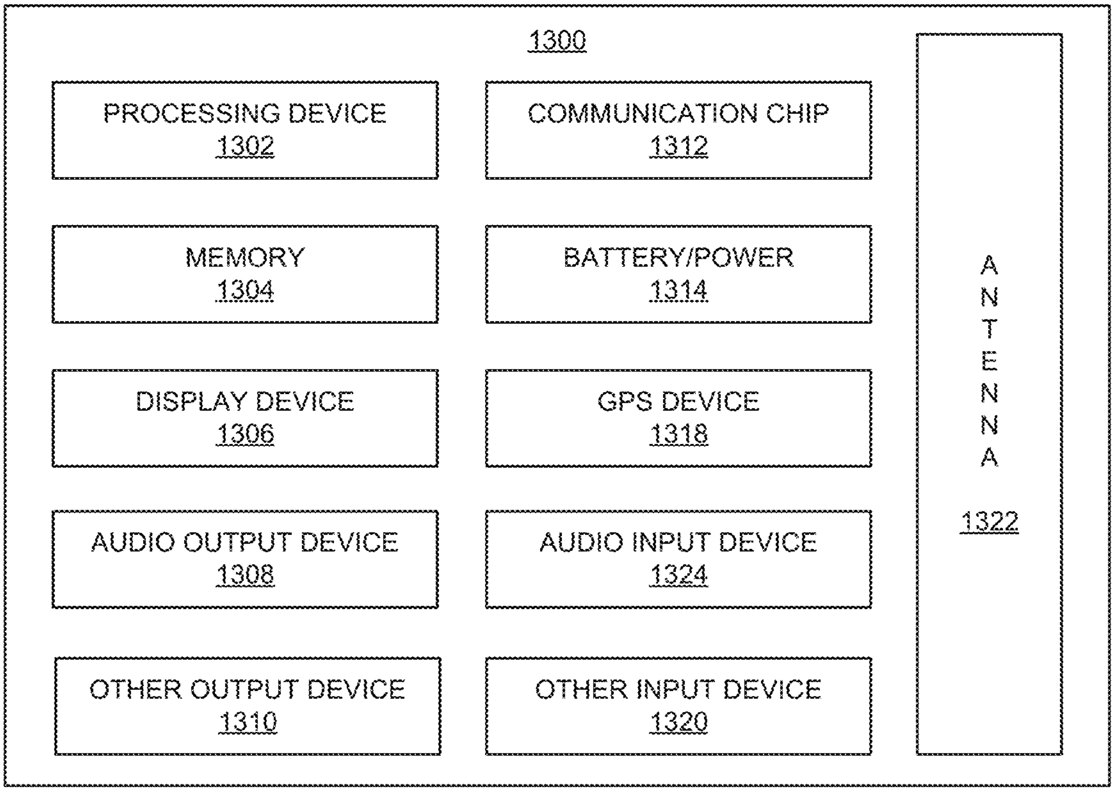
FIG. 13 is a block diagram of an example electrical device that may include an IC package constructed in accordance with teachings disclosed herein.

FIG. 13 is a block diagram of an example electrical device 1300 that may include one or more of the example IC packages 100 of FIG. 1. For example, any suitable ones of the components of the electrical device 1300 may include one or more of the device assemblies 1200, IC devices 1100, or dies 1002 disclosed herein, and may be arranged in the example IC package 100. A number of components are illustrated in FIG. 13 as included in the electrical device 1300, but any one or more of these components may be omitted or duplicated, as suitable for the application. In some examples, some or all of the components included in the electrical device 1300 may be attached to one or more motherboards. In some examples, some or all of these components are fabricated onto a single system-on-a-chip (SoC) die.

Additionally, in various examples, the electrical device 1300 may not include one or more of the components illustrated in FIG. 13, but the electrical device 1300 may include interface circuitry for coupling to the one or more components. For example, the electrical device 1300 may not include a display device 1306, but may include display device interface circuitry (e.g., a connector and driver circuitry) to which a display device 1306 may be coupled. In another set of examples, the electrical device 1300 may not include an audio input device 1324 or an audio output device 1308, but may include audio input or output device interface circuitry (e.g., connectors and supporting circuitry) to which an audio input device 1324 or audio output device 1308 may be coupled.

The electrical device 1300 may include a processing device 1302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1300 may include a memory 1304, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 1304 may include memory that shares a die with the processing device 1302. This memory may be used as cache memory and may include embedded dynamic random access memory (eDRAM) or spin transfer torque magnetic random access memory (STT-MRAM).

In some examples, the electrical device 1300 may include a communication chip 1312 (e.g., one or more communication chips). For example, the communication chip 1312 may be configured for managing wireless communications for the transfer of data to and from the electrical device 1300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1312 may operate in accordance with other wireless protocols in other examples. The electrical device 1300 may include an antenna 1322 to facilitate wireless communications and/or to receive other wireless communications (such as AM or FM radio transmissions).

In some examples, the communication chip 1312 may manage wired communications, such as electrical, optical, or any other suitable communication protocols (e.g., the Ethernet). As noted above, the communication chip 1312 may include multiple communication chips. For instance, a first communication chip 1312 may be dedicated to shorter-range wireless communications such as Wi-Fi or Bluetooth, and a second communication chip 1312 may be dedicated to longer-range wireless communications such as global positioning system (GPS), EDGE, GPRS, CDMA, WiMAX, LTE, EV-DO, or others. In some examples, a first communication chip 1312 may be dedicated to wireless communications, and a second communication chip 1312 may be dedicated to wired communications.

The electrical device 1300 may include battery/power circuitry 1314. The battery/power circuitry 1314 may include one or more energy storage devices (e.g., batteries or capacitors) and/or circuitry for coupling components of the electrical device 1300 to an energy source separate from the electrical device 1300 (e.g., AC line power).

The electrical device 1300 may include a display device 1306 (or corresponding interface circuitry, as discussed above). The display device 1306 may include any visual indicators, such as a heads-up display, a computer monitor, a projector, a touchscreen display, a liquid crystal display (LCD), a light-emitting diode display, or a flat panel display.

The electrical device 1300 may include an audio output device 1308 (or corresponding interface circuitry, as discussed above). The audio output device 1308 may include any device that generates an audible indicator, such as speakers, headsets, or earbuds.

The electrical device 1300 may include an audio input device 1324 (or corresponding interface circuitry, as discussed above). The audio input device 1324 may include any device that generates a signal representative of a sound, such as microphones, microphone arrays, or digital instruments (e.g., instruments having a musical instrument digital interface (MIDI) output).

The electrical device 1300 may include a GPS device 1318 (or corresponding interface circuitry, as discussed above). The GPS device 1318 may be in communication with a satellite-based system and may receive a location of the electrical device 1300, as known in the art.

The electrical device 1300 may include any other output device 1310 (or corresponding interface circuitry, as discussed above). Examples of the other output device 1310 may include an audio codec, a video codec, a printer, a wired or wireless transmitter for providing information to other devices, or an additional storage device.

The electrical device 1300 may include any other input device 1320 (or corresponding interface circuitry, as discussed above). Examples of the other input device 1320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1300 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 1300 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3)

at least one A and at least one B. As used herein in the context of describing the performance or execution of processes, instructions, actions, activities and/or steps, the phrase “at least one of A and B” is intended to refer to implementations including any of (1) at least one A, (2) at least one B, or (3) at least one A and at least one B. Similarly, as used herein in the context of describing the performance or execution of processes, instructions, actions, activities and/or steps, the phrase “at least one of A or B” is intended to refer to implementations including any of (1) at least one A, (2) at least one B, or (3) at least one A and at least one B.

As used herein, singular references (e.g., “a”, “an”, “first”, “second”, etc.) do not exclude a plurality. The term “a” or “an” object, as used herein, refers to one or more of that object. The terms “a” (or “an”), “one or more”, and “at least one” are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that implement an inductive and capacitive compensation structure that increases mutual capacitance between balls in a ball grid array to thereby reduce crosstalk while at the same time increases impedance at the balls to reduce impedance discontinuities. The reduction in impedance discontinuities is achieved by implementing an inductive loop within the signal path of a metal interconnect adjacent a corresponding ball. Further, the reduction in crosstalk is achieved by incorporating a coupling pad on the inductive loop such that the coupling pad is positioned in proximity with a contact pad associated with an adjacent ball. These improvements can improve the performance of IC packages containing such inductance and capacitance compensation structure. More particularly, for DDR memory packages, these improvements enable an increase in the speed bin at which the package may perform. Disclosed systems, methods, apparatus, and articles of manufacture are accordingly directed to one or more improvement(s) in the operation of a machine such as a computer or other electronic and/or mechanical device.

Example 1 includes an apparatus comprising a package substrate, a ball grid array on a first surface of the package substrate, the ball grid array including a first ball and a second ball adjacent the first ball, the ball grid array to enable the package substrate to be electrically coupled to a circuit board, and a metal interconnect within the package substrate, the metal interconnect electrically coupled to the first ball, the metal interconnect including an inductive loop that extends toward the second ball.

Example 2 includes the apparatus of example 1, further including first and second contact pads on the first surface of the package substrate, the first and second contact pads associated with the first and second balls respectively, the metal interconnect electrically coupled to the first ball through the first contact pad, the inductive loop in proximity to the second contact pad such that the second contact pad is between the inductive loop and the second ball.

Example 3 includes the apparatus of example 2, wherein the package substrate includes multiples layers of metal separated by intervening layers of dielectric material, the first and second contact pads in a first metal layer of the multiple layers of metal, the inductive loop in a second metal layer of the multiple layers of metal, the second metal layer adjacent the first metal layer with no other metal layers therebetween.

Example 4 includes the apparatus of any one of examples 2 or 3, wherein the inductive loop includes a coupling pad positioned between first and second arms of the inductive loop, the coupling pad in proximity to the second contact pad.

Example 5 includes the apparatus of any one of examples 1-4, wherein a portion of the inductive loop is curved.

Example 6 includes the apparatus of any one of examples 1-5, wherein a portion of the inductive loop is straight.

Example 7 includes the apparatus of any one of examples 1-6, wherein the inductive loop includes multiple loops.

Example 8 includes the apparatus of example 7, wherein the multiple loops are arranged in a spiral-like configuration in a metal layer of the package substrate.

Example 9 includes the apparatus of example 7, wherein different ones of the multiple loops are in different metal layers of the package substrate.

Example 10 includes the apparatus of any one of examples 1-7, wherein different portions of the inductive loop are in different metal layers of the package substrate.

Example 11 includes the apparatus of any one of examples 1-10, wherein the metal interconnect includes a first via stack and a second via stack laterally offset relative to the first via stack, a first end of the inductive loop connected to a first via pad in the first via stack and a second end of the inductive loop connected to a second via pad in the second via stack.

Example 12 includes the apparatus of example 11, wherein a metal via extends between the first via pad and a contact pad associated with the first ball, and a layer of dielectric material separates the second via pad from the contact pad.

Example 13 includes the apparatus of any one of examples 11 or 12, wherein the second via stack includes a third via pad and a first metal via, the first metal via extends between the second and third via pads, the first via stack includes a fourth via pad, and a metal trace extends between the third via pad and the fourth via pad.

Example 14 includes the apparatus of example 13, wherein a layer of dielectric material separates the first via pad from the fourth via pad.

Example 15 includes the apparatus of any one of examples 11-14, wherein the first via stack and the second via stack are both laterally positioned within a perimeter of a contact pad associated with the first ball.

Example 16 includes an integrated circuit (IC) package comprising a package substrate including a first surface and a second surface opposite the first surface, a ball grid array on the first surface of the package substrate, a semiconductor die on the second surface of the package substrate, and a metal interconnect defining a path for electrical signals to pass between the semiconductor die and a first ball of the ball grid array, the metal interconnect including an inductive loop.

Example 17 includes the IC package of example 16, wherein a first end of the inductive loop is electrically connected to a first metal via that is in contact with a contact pad, the contact pad associated with the first ball, a second end of the inductive loop is electrically connected to a second metal via, the first metal via aligned with the second metal via in a direction perpendicular to the contact pad, the first metal via separated from the second metal via by a layer of dielectric material.

Example 18 includes the IC package of any one of examples 16 or 17, further including a coupling pad positioned along a length of the inductive loop at a point distal to the first ball, the coupling pad aligned with and facing a contact pad associated with a second ball of the ball grid array.

Example 19 includes the IC package of any one of examples 16-18, wherein the IC package is a DDR memory package.

Example 20 includes an apparatus comprising a package substrate to support a semiconductor die on a first surface of the package substrate, the package substrate including a ball grid array on a second surface of the package substrate, the second surface opposite the first surface, and metal interconnects to electrically couple the semiconductor die to the ball grid array, the metal interconnects including means for reducing an impedance discontinuity at a first ball of the ball grid array.

Example 21 includes the apparatus of example 20, wherein the impedance discontinuity reducing means is to define a path along which electrical signals are to be carried between the semiconductor die and the first ball.

Example 22 includes the apparatus of any one of examples 20 or 21, wherein the impedance discontinuity reducing means is in a first metal layer that is adjacent to a second metal layer, the second metal layer including a contact pad associated with the first ball.

Example 23 includes the apparatus of any one of examples 20-22, wherein the impedance discontinuity reducing means includes means for reducing crosstalk between the first ball and a second ball adjacent the first ball.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus comprising:

a package substrate;

a ball grid array on a first surface of the package substrate, the ball grid array including a first ball and a second ball adjacent the first ball, the ball grid array to enable the package substrate to be electrically coupled to a circuit board; and a metal interconnect within the package substrate, the metal interconnect electrically coupled to the first ball, the metal interconnect including an inductive loop that extends toward the second ball, a portion of the inductive loop is straight.

2. The apparatus of claim 1, including first and second contact pads on the first surface of the package substrate, the first and second contact pads associated with the first and second balls respectively, the metal interconnect electrically coupled to the first ball through the first contact pad, the inductive loop in proximity to the second contact pad such that the second contact pad is between the inductive loop and the second ball.

3. The apparatus of claim 2, wherein the package substrate includes multiple layers of metal separated by intervening layers of dielectric material, the first and second contact pads in a first metal layer of the multiple layers of metal, the inductive loop in a second metal layer of the multiple layers of metal, the second metal layer adjacent the first metal layer with no other metal layers therebetween.

4. The apparatus of claim 1, wherein a portion of the inductive loop is curved.

5. The apparatus of claim 1, wherein the inductive loop includes multiple loops.

6. The apparatus of claim 5, wherein the multiple loops are in a spiral-like configuration in a metal layer of the package substrate.

7. The apparatus of claim 5, wherein different ones of the multiple loops are in different metal layers of the package substrate.

8. The apparatus of claim 1, wherein different portions of the inductive loop are in different metal layers of the package substrate.

9. An apparatus comprising:

a package substrate;

a ball grid array carried by a first surface of the package substrate, the ball grid array including a first ball and a second ball adjacent the first ball, the ball grid array to enable the package substrate to be electrically coupled to a circuit board;

a metal interconnect within the package substrate, the metal interconnect electrically coupled to the first ball, the metal interconnect including an inductive loop that extends toward the second ball, the inductive loop including a coupling pad between first and second arms of the inductive loop; and first and second contact pads carried by the first surface of the package substrate, the first and second contact pads associated with the first and second balls respectively, the metal interconnect electrically coupled to the first ball through the first contact pad, the inductive loop in proximity to the second contact pad such that the second contact pad is between the inductive loop and the second ball, the coupling pad in proximity to the second contact pad.

10. An apparatus comprising:

a package substrate;

a ball grid array distributed along a first surface of the package substrate, the ball grid array including a first ball and a second ball adjacent the first ball, the ball grid array to enable the package substrate to be electrically coupled to a circuit board; and a metal interconnect within the package substrate, the metal interconnect electrically coupled to the first ball, the metal interconnect including an inductive loop that extends toward the second ball, the metal interconnect including a first via stack and a second via stack laterally offset relative to the first via stack, a first end of the inductive loop connected to a first via pad in the first via stack and a second end of the inductive loop connected to a second via pad in the second via stack.

11. The apparatus of claim 10, wherein a metal via extends between the first via pad and a contact pad associated with the first ball, and a layer of dielectric material separates the second via pad from the contact pad.

12. The apparatus of claim 10, wherein the second via stack includes a third via pad and a first metal via, the first metal via extends between the second and third via pads, the first via stack includes a fourth via pad, and a metal trace extends between the third via pad and the fourth via pad.

13. The apparatus of claim 12, wherein a layer of dielectric material separates the first via pad from the fourth via pad.

14. The apparatus of claim 10, wherein the first via stack and the second via stack are both within a perimeter of a contact pad associated with the first ball, the first and second via stacks spaced laterally apart.

15. An integrated circuit (IC) package comprising:

a package substrate including a first surface and a second surface opposite the first surface;

a ball grid array on the first surface of the package substrate;

a semiconductor die on the second surface of the package substrate;

a metal interconnect defining a path for electrical signals to pass between the semiconductor die and a first ball of the ball grid array, the metal interconnect including an inductive loop; and a coupling pad located along a length of the inductive loop at a point distal to the first ball, the coupling pad aligned with and facing a contact pad associated with a second ball of the ball grid array.

16. The IC package of claim 15, wherein the IC package is a DDR memory package.

17. An integrated circuit (IC) package comprising:

a package substrate including a first surface and a second surface opposite the first surface;

a ball grid array on the first surface of the package substrate;

a semiconductor die on the second surface of the package substrate; and a metal interconnect defining a path for electrical signals to pass between the semiconductor die and a first ball of the ball grid array, the metal interconnect including an inductive loop, a first end of the inductive loop is electrically connected to a first metal via that is in contact with a contact pad, the contact pad associated with the first ball, a second end of the inductive loop is electrically connected to a second metal via, the first metal via aligned with the second metal via in a direction perpendicular to the contact pad, the first metal via separated from the second metal via by a layer of dielectric material.

18. An apparatus comprising:

a package substrate to support a semiconductor die on a first surface of the package substrate, the package substrate including a ball grid array on a second surface of the package substrate, the second surface opposite the first surface;

metal interconnects to electrically couple the semiconductor die to the ball grid array, the metal interconnects including means for reducing an impedance discontinuity at a first ball of the ball grid array; and means for reducing crosstalk located along a length of the impedance discontinuity reducing means at a point distal to the first ball, the crosstalk reducing means aligned with and facing a contact pad associated with a second ball of the ball grid array.

19. The apparatus of claim 18, wherein the impedance discontinuity reducing means is to define a path along which electrical signals are to be carried between the semiconductor die and the first ball.

20. The apparatus of claim 18, wherein the contact pad is a first contact pad, and the impedance discontinuity reducing means is in a first metal layer that is adjacent to a second metal layer, the second metal layer including a second contact pad associated with the first ball.

* * * * *